United States Patent

Matsushima et al.

[11] Patent Number: 5,947,677
[45] Date of Patent: Sep. 7, 1999

[54] CASSETTE TRANSFER MECHANISM

[75] Inventors: Keiichi Matsushima, Kofu; Teruo Asakawa, Yamanashi-ken, both of Japan

[73] Assignee: Tokyo Electron Limited, Japan

[21] Appl. No.: 08/969,846

[22] Filed: Nov. 13, 1997

[30] Foreign Application Priority Data

Nov. 20, 1996 [JP] Japan .................................. 8-324783

[51] Int. Cl.$^6$ .................................................. B65G 65/00
[52] U.S. Cl. .................... 414/609; 414/331.18; 414/416; 414/778; 414/779; 414/937; 414/940
[58] Field of Search .................... 414/609, 217, 414/331, 416, 937, 939, 940, 917, 778, 779, 331.18

[56] References Cited

U.S. PATENT DOCUMENTS

| | | | |
|---|---|---|---|
| 4,674,936 | 6/1987 | Bonora | 414/939 X |
| 4,859,137 | 8/1989 | Bonora et al. | 414/939 X |
| 5,180,273 | 1/1993 | Sakaya et al. | 414/940 X |
| 5,186,594 | 2/1993 | Toshima et al. | 414/217 |
| 5,356,261 | 10/1994 | Nishi | 414/940 X |
| 5,468,112 | 11/1995 | Ishii et al. | 414/939 X |
| 5,474,410 | 12/1995 | Ozawa et al. | 414/940 X |
| 5,507,614 | 4/1996 | Leonov et al. | 414/940 X |
| 5,538,385 | 7/1996 | Bacchi et al. | 414/940 X |
| 5,664,926 | 9/1997 | Sussman et al. | 414/778 X |
| 5,715,929 | 2/1998 | Scheler et al. | 414/940 X |
| 5,788,448 | 8/1998 | Wakamori et al. | 414/940 X |
| 5,810,538 | 9/1998 | Ozawa et al. | 414/939 X |

FOREIGN PATENT DOCUMENTS 3-261161  11/1991  Japan .................................. 414/940

*Primary Examiner*—David A. Bucci
*Attorney, Agent, or Firm*—Graham & James LLP

[57] ABSTRACT

The cassette transfer mechanism of the present invention comprises a cassette chamber for housing a cassette storing a plurality of substrates, a liftable stand capable of moving up and down in the cassette chamber, a cassette holder having a bottom-surface supporting portion for supporting a bottom-surface of the cassette and a back-surface supporting portion for supporting a back-surface of the cassette, and a moving mechanism provided outside the cassette chamber and rotatably supporting the cassette holder, for moving the cassette holder between a waiting position outside the cassette chamber and the liftable stand inside the cassette chamber, wherein the moving mechanism has rotation mechanism for rotating the cassette holder around an axis crossed virtually in perpendicular to an axis extending along the moving direction of the liftable stand.

10 Claims, 10 Drawing Sheets

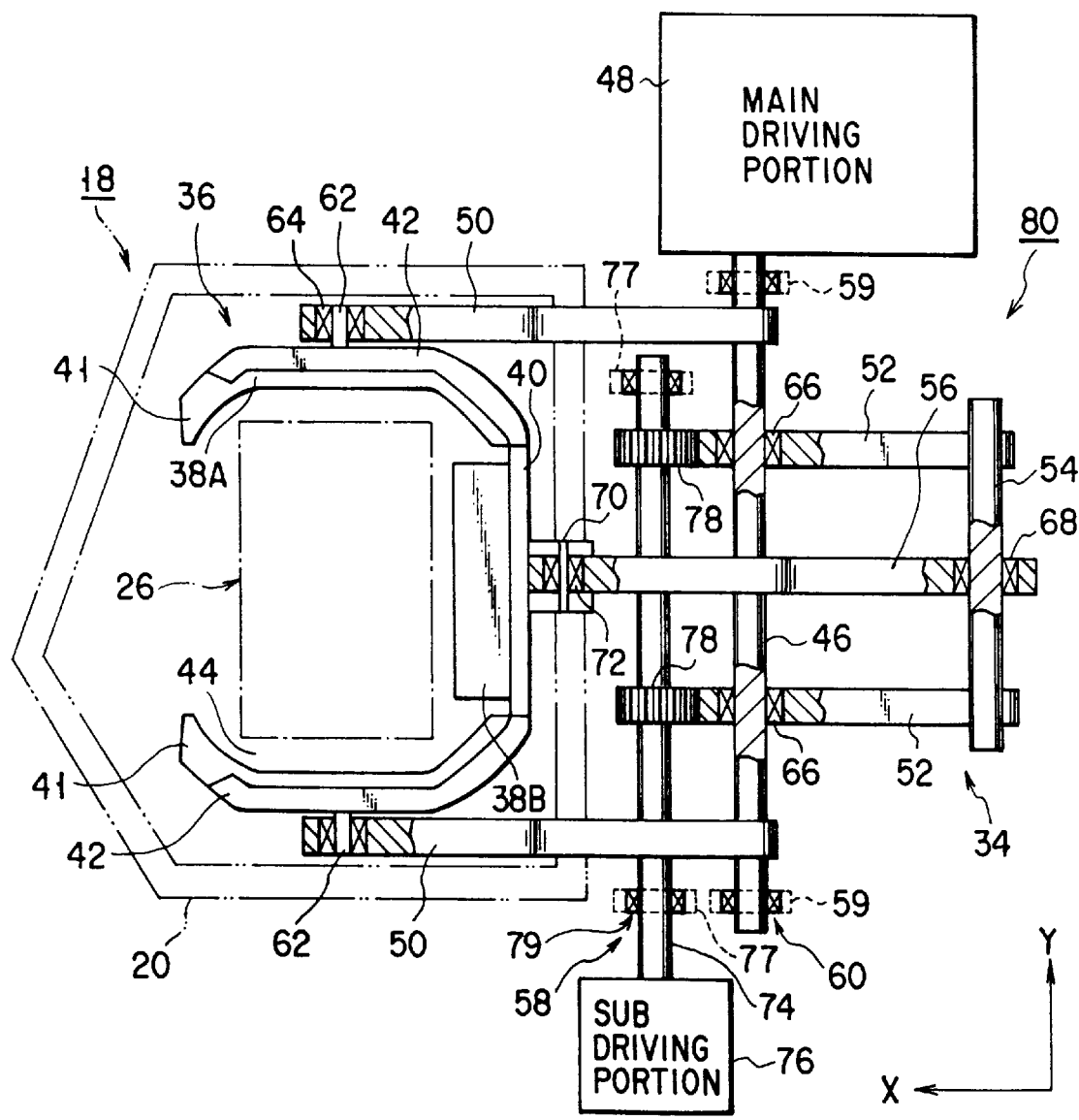
F I G. 2

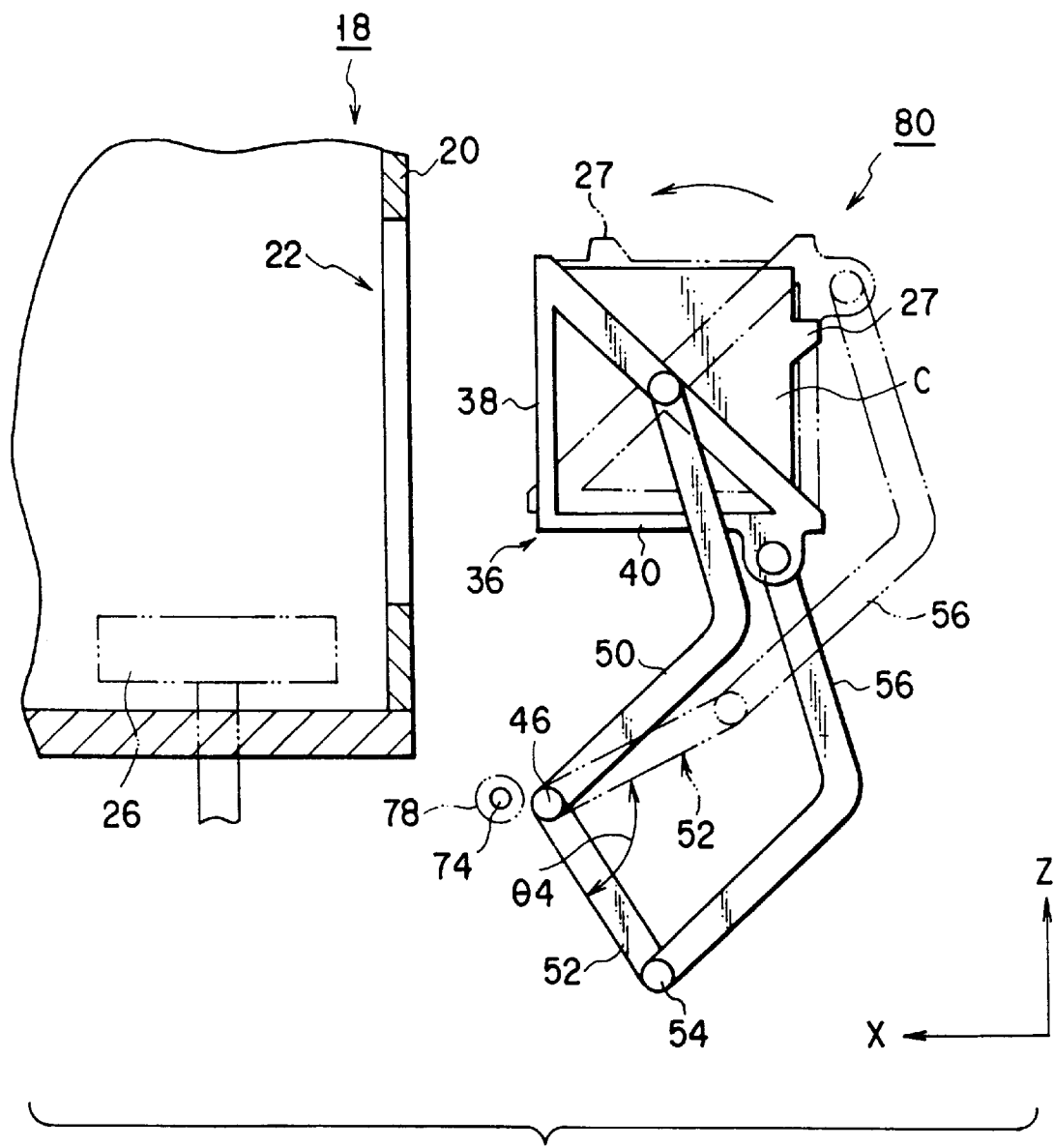
F I G. 5

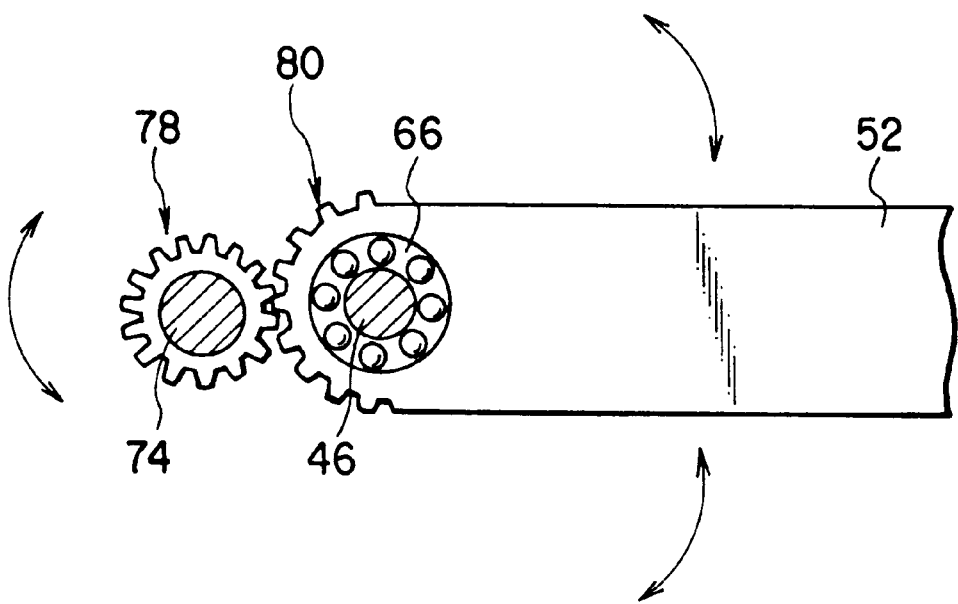
F I G. 7
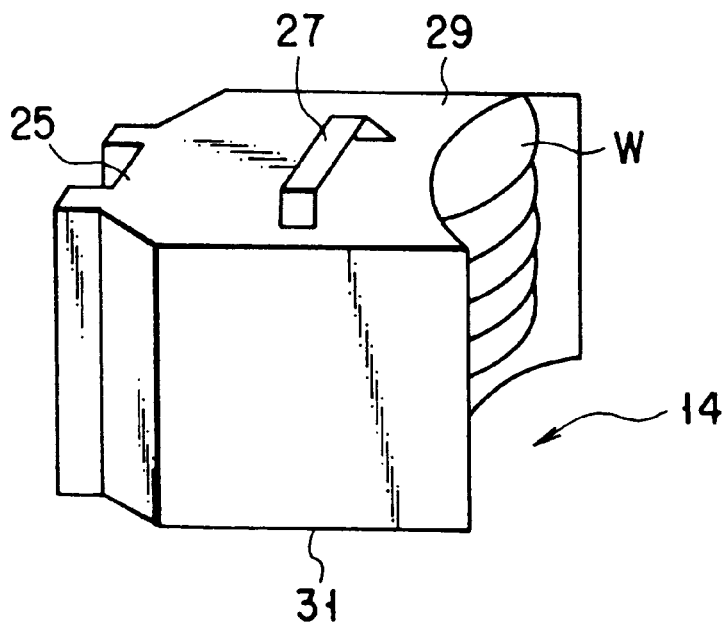
F I G. 8

CASSETTE TRANSFER MECHANISM

BACKGROUND OF THE INVENTION

The present invention relates to a cassette transfer mechanism for transferring a cassette storing substrates such as semiconductor wafers to a substrate unloading position at which the substrate is taken out from the cassette.

When a semiconductor wafer is treated in various processes including a film formation process, an etching process, and a thermal oxidation process, a cassette storing a plurality of semiconductor wafers (e.g. 25 wafers) is first placed in a cassette chamber. Thereafter, one of the wafers stored in the cassette is transferred from the cassette chamber by a transfer arm through a transfer chamber to a process chamber under a vacuum.

When the cassette is set within the cassette chamber, the cassette is first set on a stage of the cassette chamber. At this point, the wafer loading entrance of the cassette is turned upward. Thereafter, the cassette is rotated about 90 degrees and simultaneously taken into the cassette chamber by a drawbridge-form moving mechanism installed therein. Consequently, the upwardly-provided wafer loading entrance turns sideward in the horizontal direction.

Although the transfer chamber has only one transfer arm therein, a plurality of cassette chambers, for example, two cassette chambers, are usually connected to the transfer chamber. For this construction, one transfer arm must access two cassettes in the cassette chambers. Hence, each cassette must be turned in such a way that the wafer loading entrance facing in the horizontal direction corresponds to the accessing direction of the transfer arm.

FIG. 9 shows a cluster tool having process chambers for processing a semiconductor wafer W. The wafer W is sent to a process chamber by the aforementioned serial operation and processed therein. The cluster tool mainly consists of two process chambers (2, 4), a transfer chamber 6 connected to process chambers (2, 4), and two cassette chambers (8, 10) connected to the transfer chamber 6. Individual chambers are communicable with each other via a gate valve G1 closed airtight. The transfer chamber 6 has a flexibly-bending rotatable arm, for example, a multi-joint transfer arm 12, installed therein, as shown in FIG. 10. The transfer arm 12 plays a part in loading/unloading the semiconductor wafer W into/from the cassette C housed in each of cassette chambers (8, 10).

When the cassette C is mounted on a stage placed outside a gate door (G1) of each of the cassette chambers (8, 10), it is often placed in the X-axis direction with a wafer loading entrance 14 turned upward (in the Z-axis direction), depending upon the entire construction of the system or other conditions. To take the cassette C into the cassette chambers (8, 10) and to take out a semiconductor wafer W from two cassettes (C, C) of the cassette chambers (8, 10) by one transfer arm 12, the wafer loading entrance 14 of the cassette C must be brought to face the center of the transfer arm 12 (transfer arm access direction A) by raising the cassette C in the vertical direction and rotating it horizontally.

The aforementioned operation is actually performed in apparatuses disclosed in, for example, U.S. Pat. Nos. 5,186,594 and 5,507,614. In U.S. Pat. No. 5,186,594, a cassette C is first mounted on a stage outside a cassette chamber 8 with a wafer loading entrance 14 turned upward. Then, the cassette C is rotated around the Y-axis by a drawbridge-form moving mechanism by 90 degrees. In this manner, the cassette C is taken into the cassette chamber 8; at the same time, the wafer loading entrance 14 facing upward (Z direction) is turned sideward in the horizontal direction (X-direction). Thereafter, the cassette C is rotated around the Z-axis by a predetermined angle θ by a pivot mechanism. In this rotation, the wafer loading entrance 14 is turned to the center of the arm 12 (see FIG. 11). In U.S. Pat. No. 5,507,614, a cassette C can be brought into a desired position in one step by rotating an inclined axis having a predetermined angle with the gravity direction. Consequently, the wafer loading entrance 14 is turned toward the center of the arm 12.

In the apparatus disclosed in U.S. Pat. No. 5,186,594, the cassette chamber 8, 10 (vacuum chamber) contains two moving mechanisms, namely, a drawbridge-form moving mechanism (for rotating the cassette C around the Y axis by 90 degrees) and a pivot mechanism (for rotating the cassette C around the Z-axis by a predetermined angle). Construction of the cassette chamber is complicated by a plurality of moving mechanisms. Also, due to a plurality of moving mechanisms, the manufacturing cost and the amount of generated particles increase.

On the other hand, the apparatus disclosed in U.S. Pat. No. 5,507,614 employs the inclined rotation axis. When the inclined rotation axis is rotated, the amount of particles generated due to the rotation increases because of the uneven movement of the rotation axis, as compared to the horizontal rotation. The diagonal rotation of the cassette C requires a broader space, increasing the size of the chamber.

BRIEF SUMMARY OF THE INVENTION

An object of the present invention is to provide a cassette transfer mechanism for transferring a cassette storing substrates such as semiconductor substrates to a substrate unloading position, at which a substrate is taken out from the cassette. More particularly, the object of the present invention is to provide a cassette transfer mechanism capable of suppressing generation of particles in a cassette chamber, reducing the size of the cassette chamber, and turning a wafer loading entrance toward the transfer arm access direction along which a substrate is unloaded.

The object of the present invention can be attained by the cassette transfer mechanism comprising:
- a cassette chamber for housing a cassette having a plurality of substrates stored therein;
- a liftable stand movable up and down in the cassette chamber;
- a cassette holder having a bottom-surface supporting portion for supporting a bottom-surface of the cassette and a back-surface supporting portion for supporting a back surface of the cassette; and
- a moving mechanism provided outside the cassette chamber and rotatably supporting the cassette holder, for moving the cassette holder between a waiting position outside the cassette chamber and the liftable stand in the cassette chamber.

The moving mechanism has rotation means for rotating the cassette holder around an axis crossed in perpendicular to an axis which extends along the moving direction of the liftable stand.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 2 is a plan view of the cassette transfer means of FIG. 1;

FIG. 5 is a side view of the cassette transfer mechanism of FIG. 1, showing a second operation;

FIG. 7 is a magnified view of an engaged portion of a second arm member with a sub driving axis, both constituting the cassette transfer mechanism of FIG. 1;

FIG. 8 is a perspective view of a cassette;

DETAILED DESCRIPTION OF THE INVENTION

Hereinbelow, an embodiment of the present invention will be explained with reference to the accompanying drawings.

Figure 9:
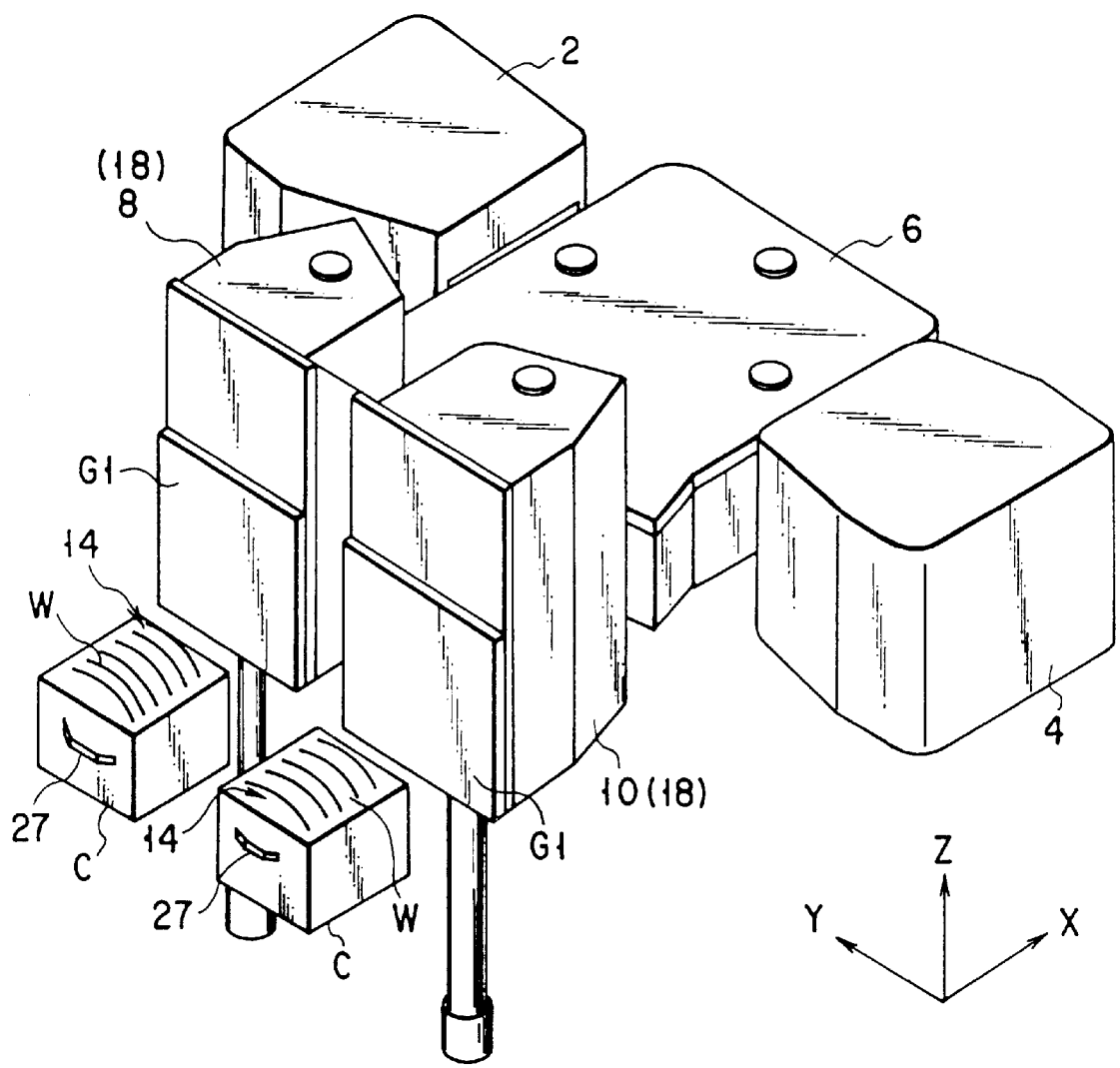
FIG. 9 is a perspective view of a typical cluster tool having a cassette chamber.
Figure 10:
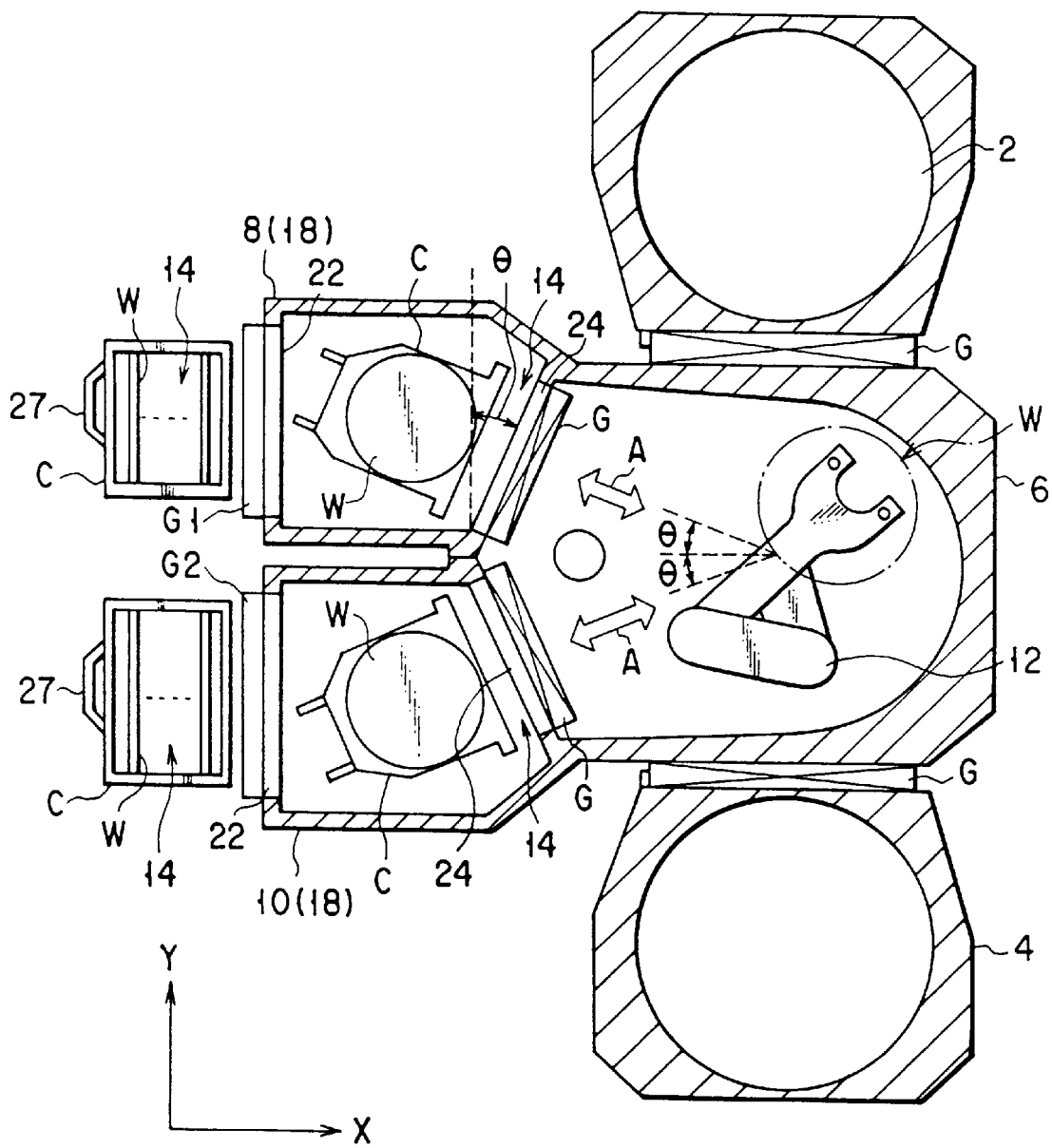
FIG. 10 is a horizontal sectional view of the cluster tool of FIG. 9.
Figure 11:
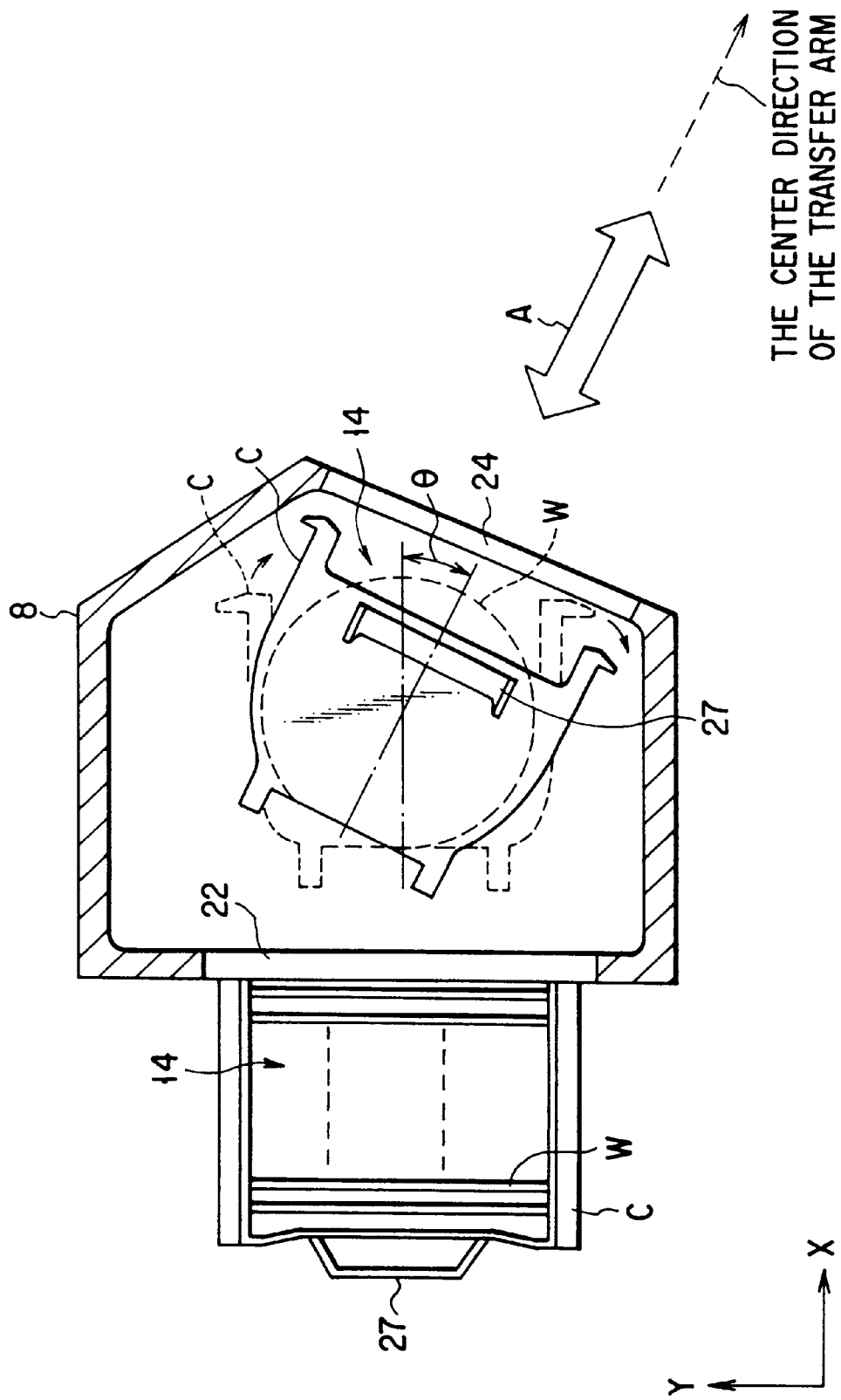
FIG. 11 is a partial plan view of a conventional cassette transfer mechanism, for explaining how to set a cassette at a wafer transfer position.

FIGS. 1 to 7 show a cassette transfer mechanism according to an embodiment of the present invention. The cassette transfer mechanism of this embodiment comprises a cassette chamber 18 and a loading device 80 for loading/unloading a cassette C into and from the cassette chamber 18. The cassette chamber 18 is connected to a transfer chamber 6 having a transfer arm 12 therein in the same as cassette chambers (8, 10) of the cluster tool shown in FIGS. 9 and 10.

Figure 1:
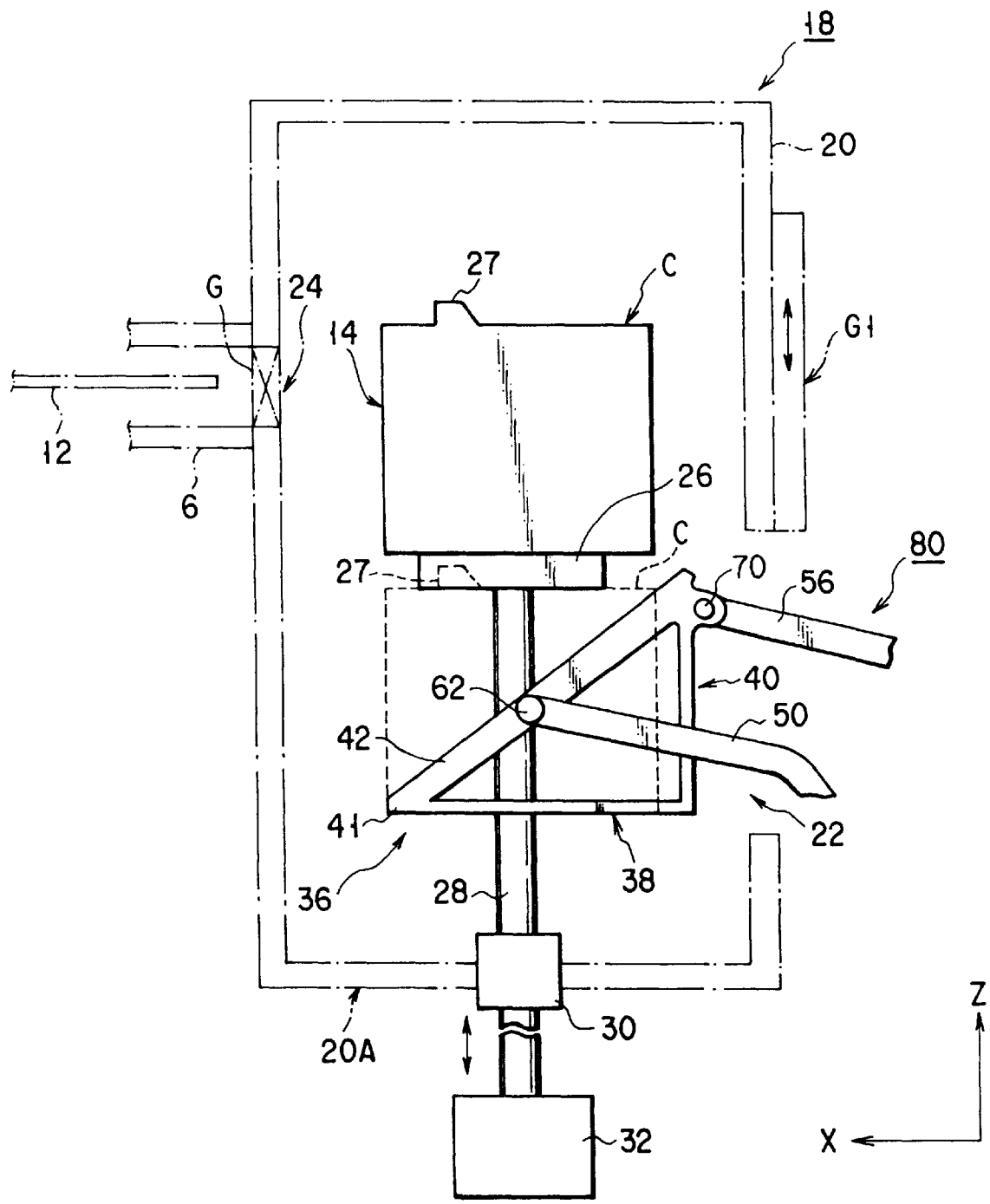
FIG. 1 is a schematical side view of a cassette transfer mechanism according to an embodiment of the present invention.
Figure 3:
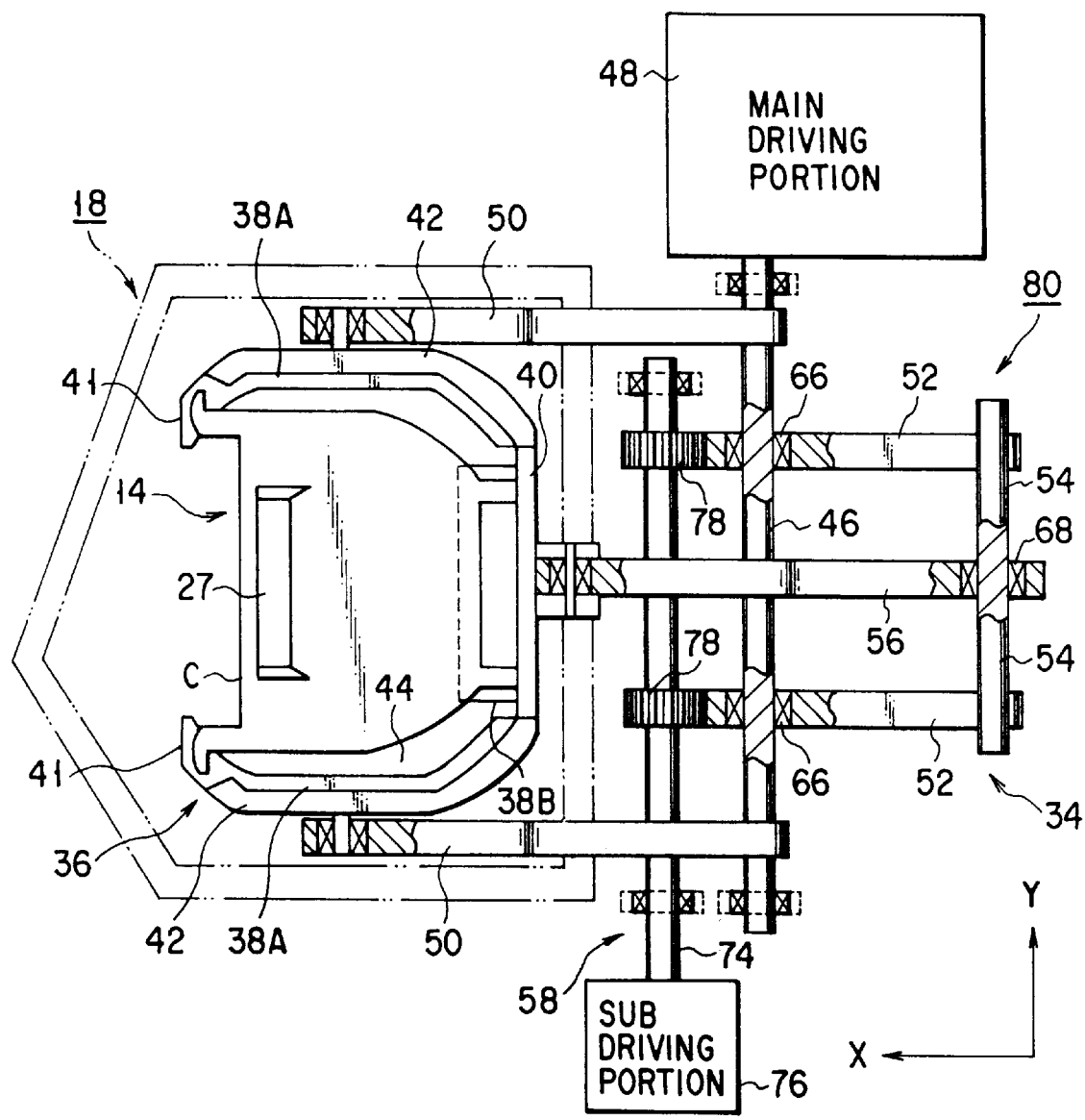
FIG. 3 is a plan view of a cassette transfer mechanism holding a cassette.

As shown in FIG. 1, the cassette chamber 18 has a rectangular chamber container 20 made of, for example, aluminum. A cassette loading entrance 22 for passing through the cassette C is provided through one of side walls of the chamber container 20. The cassette loading entrance 22 is opened and closed by a gate door G1. A wafer unloading opening 24 is provided on the opposite side wall of the chamber container 20. The transfer chamber 6 is connected to the unloading opening 24 via an openable gate valve G. As clearly shown in FIG. 10, although the cassette loading entrance 22 is opened toward the X direction, the wafer unloading opening 24 is opened toward a direction crossed with the X-axis at a predetermined angle θ (for example, 22.5 degrees), that is, an access direction A along which a transfer arm 12 (provided in the transfer chamber) accesses the cassette chamber 18.

Note that the cassette C is capable of containing, for example, 25 semiconductor wafers W. The cassette C has a wafer loading entrance 14 for loading/unloading the semiconductor wafer W into/from the cassette, as shown in FIG. 8. The side wall opposite to the wafer loading entrance 14 is referred to as a back surface 25. The cassette C has an upper surface 29 provided with a handle 27 and a bottom surface 31.

As shown in FIG. 1, a liftable stand 26 is provided within the chamber container 20. To the bottom surface of the liftable stand 26, a liftable rod 28 is connected. The liftable rod 28 passes through a bottom portion 20A of the chamber container 20 via, for example, an O ring seal 30, airtight. The up and down movement and rotation movement are controlled by a moving mechanism 32.

As shown in FIGS. 1 to 6, the loading device 80 is used for loading and unloading the cassette C into and from the cassette chamber 18. The loading device 80 comprises a cassette holder 36 for mounting the cassette C thereon, a moving mechanism 34 for moving the cassette holder 36. The moving mechanism 34, which is provided outside the chamber container 20, moves the cassette holder 36 between the inside and the outside of the chamber container 20.

The cassette holder 36 consists of a bottom-surface supporting portion 38 for supporting the cassette C by the bottom 31 and a back-surface supporting portion 40 for supporting the cassette C by the back 25. Both supporting portions 38 and 40 are in contact with each other at right angles. The distal end portions of the supporting portions 38 and 40 are connected with a reinforcement material 42. Hence, when the cassette holder 36 is viewed from the side, it looks like a triangle (see FIG. 1). The back-surface supporting portion 40 is formed of a virtually rectangular plate. The bottom-surface supporting portion 38 consists of a pair of side supporting plates (38A, 38A) for supporting both side edge portions of the bottom surface 31 of the cassette C and a behind-portion supporting plate 38B for supporting a behind portion (the edge portion of the bottom 31 at the back side 25) of the bottom 31 of the cassette C. A hole 44 is formed in the center of the bottom surface supporting portion 38 for permitting a liftable stand 26 to move up and down. The distal end of the bottom-surface supporting portion 38 is open at one side so as to release the cassette holder 36 from the cassette chamber 18 in a predetermined manner described later without interference with the liftable stand 26 and the liftable rod 28 after the cassette C is transferred to the liftable stand 26 as described later (shown in FIGS. 3 and 6). A curved portion 41, which is slightly bent toward the inside of the hole 44, is provided at the distal end portions of the side-portion supporting plates (38A, 38A). The bottom surface 31 of the cassette C is supported by these curved portions 41 at the distal edge (see FIG. 3).

The moving mechanism 34 comprises a main driving portion 48, a main driving axis 46, a pair of first arm members (50, 50), a pair of second arm members (52, 52), an immobilized axis 54, a third arm member 56, and a rotation driving portion 58. The main driving portion 48 consists of, for example, a step motor. The main driving axis 46 is rotated by the main driving portion 48. One end of each of the first arm members (50, 50) is fixed on the main driving axis 46 and the other end of each of them is rotatably connected to the cassette holder 36. One end of each of the second arm members (52, 52) is rotatably connected to the main driving axis 46. The fixed axis 54 has both ends to which the other end of each of the second arm members 52 is connected. One end of the third arm member 56 is rotatably connected to the fixed axis 54 and the other end is rotatably connected to the cassette holder 36. The rotation driving portion 58 rotates the second arm members (52, 52).

Figure 4:
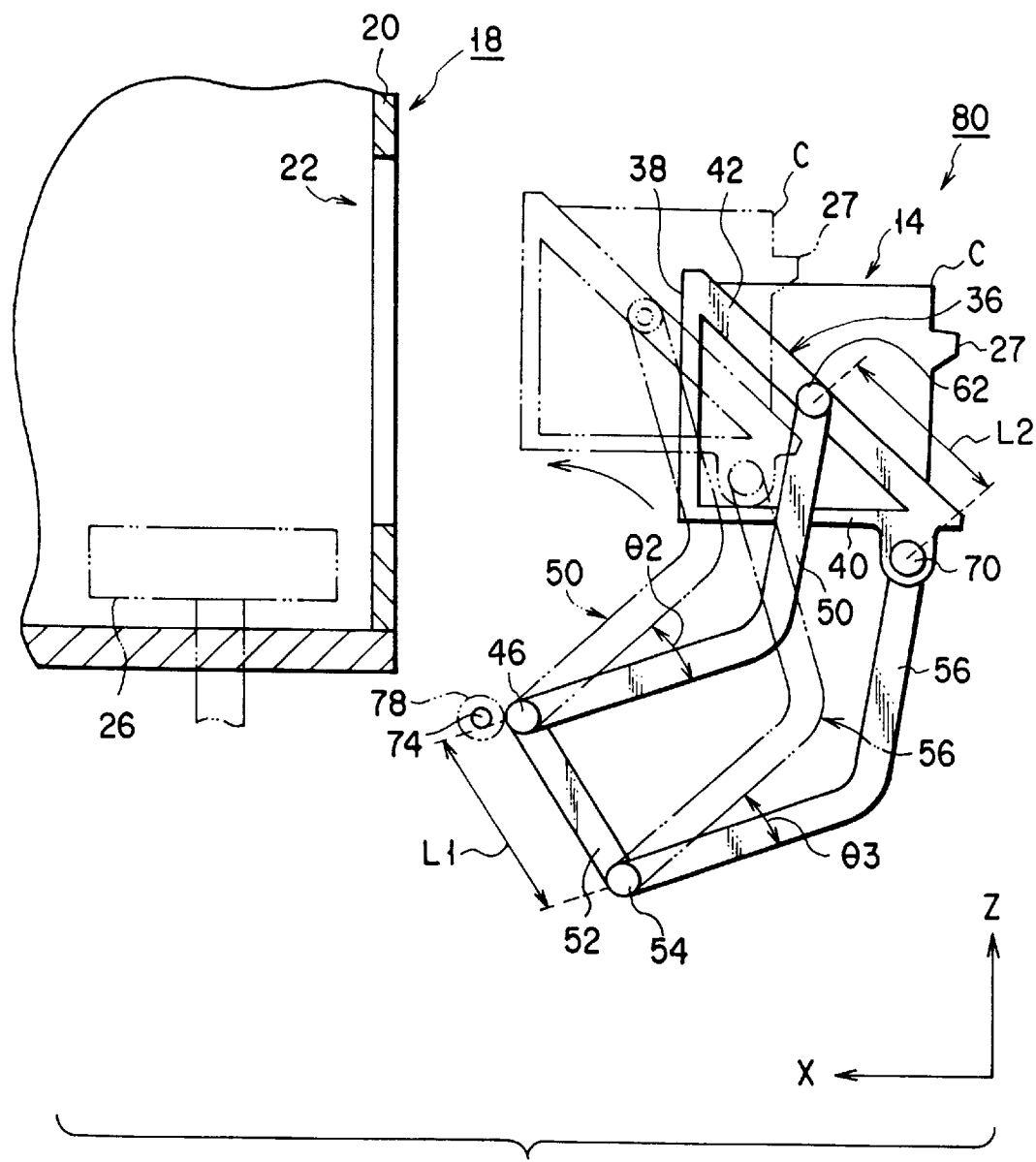
FIG. 4 is a side view of the cassette transfer mechanism of FIG. 1, showing a first operation.

Both ends of the main driving axis 46 are rotatably connected to a supporting portion 59 which extends from the outer wall of the chamber container 20 or a fixed base side (not shown), via a bearing 60. Specifically, as shown in FIG. 4, the main driving axis 46 is disposed at a position outside the chamber container 20 and lower than the cassette loading entrance 22, and extends virtually in parallel to the cassette loading entrance 22. Since the main driving axis 46 is connected to a rotation axis of the main driving portion 48 at one end, it can be rotated by at least a predetermined angle in right and reverse directions. Note that the main driving axis 46 may be connected to the main driving portion 48 via speed-reduction means (not shown) in order to control a rotation speed and a rotation angle of the main driving axis 46. The main driving portion 48 is supported by fixing it on the outer wall of the chamber container 20 or on a fixed base side (not shown).

Figure 6:
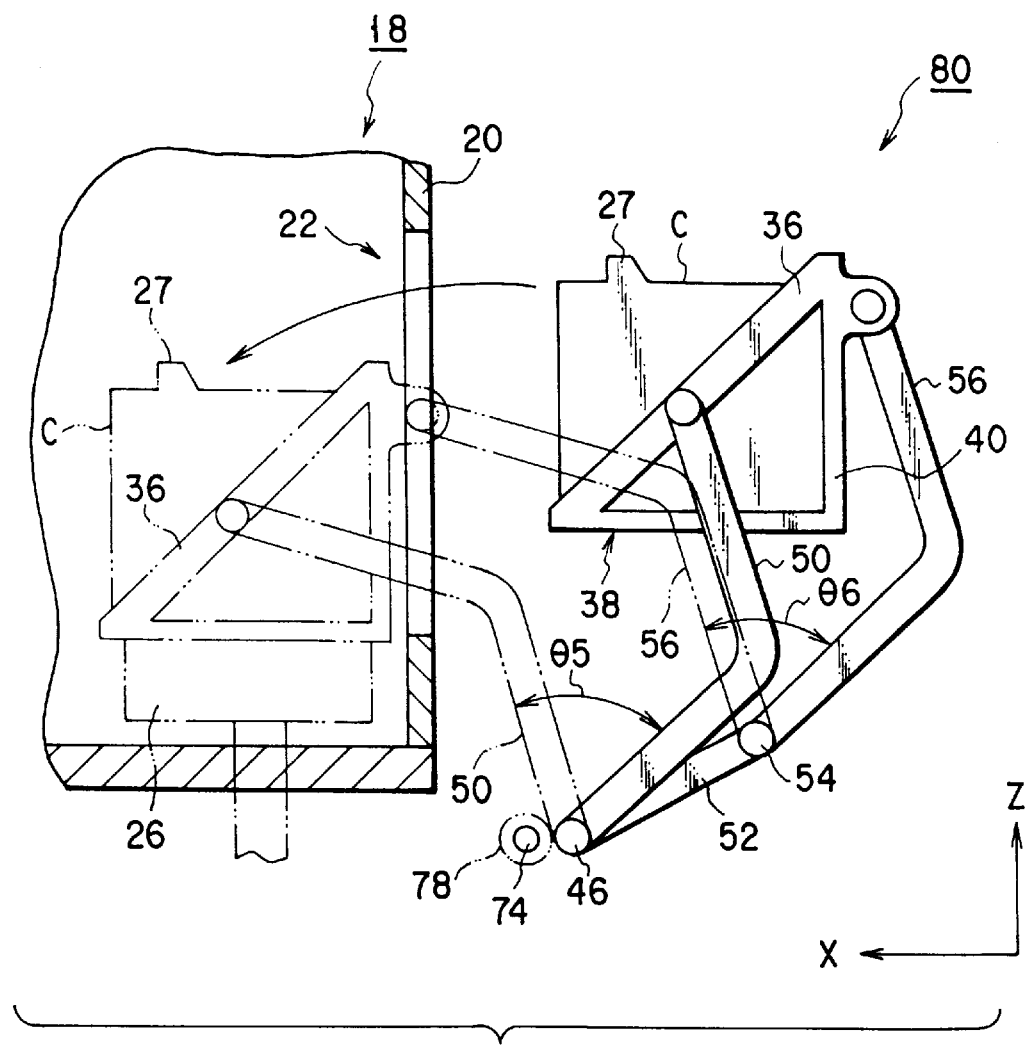
FIG. 6 is a side view of the cassette transfer mechanism of FIG. 1, showing a third operation.

A pair of the first arm members (50, 50) are bent like a boomerang, as shown in FIGS. 4 to 6. One end portion of each of the first arm members (50, 50) is fixed on the main driving axis 46, so that they are rotated in synchronism with the main driving axis 46. The other end portion of each of the first arm members (50, 50) is rotatably connected, via a bearing 64, to a receiving axis 62 provided at virtually the center of the reinforcement material 42 of the cassette holder 36. One end of each of a pair of the second arm members (52, 52) is rotatably supported by the main driving axis 46 via a bearing 66. The other end of each of the second arm members (52, 52) is connected to the fixed axis 54. The third arm member 56 is bent like a boomerang as shown in FIG. 4. One end portion of the third arm member 56 is rotatably connected to the center portion of the fixed axis 54 via a bearing 68. The other end portion of the third arm member 56 is rotatably connected, via a bearing 72, to a receiving axis 70 provided outside the back-surface supporting portion 40 of the cassette holder 36.

In this embodiment, as shown in FIG. 4, the distance L1 between a supporting point at which the second arm member 52 is connected to the main driving axis 46 and a supporting point at which the member 52 is connected to the fixed axis 54, is equal to the distance L2 between a connection point at which the first arm member 50 is connected with the cassette holder 36 and a connection point at which the third arm member 56 is connected with the cassette holder 36.

The rotation driving portion 58 for rotating the second arm members (52, 52) has a sub driving portion 76 consisting of, for example, a step motor, which is fixed on the chamber container 20 or on the fixed base side. A sub driving axis 74 is connected, directly or via speed-reduction means (not shown), to the driving axis of the sub driving portion 76. The sub driving axis 74 is provided adjacent to and in parallel to the main driving axis 46 and rotatably supported, via a bearing 79, by a supporting portion 77 which extends from the outer wall of the chamber container 20 or from a fixed base side (not shown). To the sub driving axis 74, a pair of small gears (78, 78) are fixed, as detailed in FIG. 7. Teeth 80 formed in the outer peripheral surface of an end portion of each of the second arm members (52, 52) are engaged with the small gears (78, 78). Hence, when the sub driving portion 76 is driven and the small gear 78 is rotated together with the sub driving axis 74 in right and reverse directions, the second arm members (52, 52) are rotated around the main driving axis 46 in the right and reverse directions.

Now, we will explain the operation manner of the cassette transfer mechanism constructed as mentioned above.

In FIG. 4, the liftable stand 26 is set at the lowermost position of the chamber container 20 and the cassette holder 36 is set at a waiting position (indicated by a solid line) provided outside the chamber container 20. In the waiting position, the back-surface supporting portion 40 is oriented in the horizontal direction and the bottom-surface supporting portion 38 is oriented in the vertical direction. The cassette C is mounted on the cassette holder 36 with a wafer loading entrance 14 turned upward. To be more specific, the bottom surface 31 of the cassette C is brought in contact with the bottom-surface supporting portion 38 and the back surface 25 thereof is supported by the back-surface supporting portion 40. In this way, the weight of the cassette C is supported by the back-surface supporting portion 40.

When the cassette C is transferred from the cassette holder 36 (shown in FIG. 4) to the liftable stand 26 provided within the chamber container 20 by the moving mechanism 34, the main driving portion 48 is first driven while the sub-driving portion 76 is unmoved (by fixing the small gear 78), thereby rotating the main driving axis 46 counter-clockwise by a predetermined angle θ2 in the figure. Consequently, the first arm members (50, 50) fixed on the main driving axis 46, rotate counter-clockwise by a predetermined angle θ2, as indicated by a dash-two-dot line in the figure. At this point, the second arm members (52, 52) do not move since the teeth 80 are engaged with the small gear 78. Hence, the third arm member 56 rotates counter-clockwise by an angle θ3 around the fixed axis 54 as shown in the dash-two-dot line in the figure, following the movement of the cassette holder 36 in associate with the rotation of the first arm members (50, 50). As a result, the cassette holder 36 is lifted to a predetermined height as indicated by the dash-two-dot line while it maintains the same posture (indicated by the solid line in FIG. 4) as that at the waiting position. At the same time, the cassette C is lifted to the predetermined height together with the cassette holder 36 while it maintains the horizontally-laid posture.

Thereafter, the main driving portion 48 is stopped to terminate the movement of the main driving axis 46. Then, the sub driving portion 76 is driven to rotate the small gear 78 together with the sub driving axis 74 clockwise by a predetermined angle. In this manner, the teeth 80 engaged with the small gear 78 rotates counter-clockwise and the second arm member 52 rotates counter-clockwise by a predetermined angle θ4. The posture of the second arm member 52 after the rotation is indicated by a dash-two-dot line in FIG. 5. It should be noted that the posture indicated by the dash-two-dot line in FIG. 4 is indicated by a solid line in FIG. 5.

When the second arm member 52 is rotated counter-clockwise by a predetermined angle θ4, the third arm member 56 connected to the fixed axis 54 (fixed on the second arm member 52) is also lifted as indicated by the dash-two-dot line in the figure. In this case, since the first arm members (50, 50) do not move because the main driving axis 46 is fixed, the cassette holder 36 rotates counter-clockwise by 90 degrees around the portion at which the cassette holder 36 is connected with the first arm members (50, 50). In this operation manner, the wafer loading entrance 14 of the cassette C is turned sideward in the horizontal direction (in the X-direction). The weight of the cassette C is therefore supported by the bottom-surface supporting portion 38.

Thereafter, the sub driving portion 76 is stopped to terminate the movement of the second arm members (52, 52), and the main driving portion 48 is driven. In this way, the first arm members (50, 50) are allowed to rotate counter-clockwise by a predetermined angle θ5. The posture of the first arm members 50 after the rotation is indicated by a dash-two-dot line in FIG. 6. It should be note that the posture indicated by the dash-two-dot line in FIG. 5 is indicated by a solid line in FIG. 6.

When the first arm members (50, 50) are rotated counter-clockwise by a predetermined angle θ5, the third arm member 56 is rotated counter-clockwise by an angle θ6 around the fixed axis 54 as indicated by a dash-two-dot line in the figure, following the movement of the cassette holder 36 in associated with the rotation of the first arm members (50, 50). In this operation manner, the cassette C is taken into the chamber container 20 through the cassette loading entrance 22 and mounted on the liftable stand 26, while maintaining the posture of the wafer loading-entrance 14 facing the X-direction.

When the driving mechanism 32 is allowed to drive while the posture indicated by the dash-two-dot line in FIG. 6 is maintained, the liftable stand 26 is ascended through the hole 44 of the bottom-surface supporting portion 38 and thereby supports the cassette C by the bottom. Consequently, the cassette C is transferred from the cassette holder 36 to the liftable stand 26. If the liftable stand 26 is rotated by a predetermined angle θ while being further ascended, the wafer loading entrance 14 of the cassette C is positioned so as to face the wafer unloading opening 24 (see FIG. 1). In short, the wafer loading entrance 14 is turned toward the access direction A along which the transfer arm 12 within the transfer chamber 6 is moved. In other words, the wafer loading entrance 14 is oriented toward the direction crossed the X direction at a predetermined angle θ. After the cassette C is transferred to the liftable stand 26, the moving mechanism 34 moves the cassette holder 36 to the waiting position outside the chamber container 20 in the reverse manner to the aforementioned operation.

In this embodiment, to explain operation of the arm members 50, 52 and 56 as plain as possible, the movements of the arm members 50, 52 and 56 resulting from the alternative operation of the main driving portion 48 and the sub driving portion 76 are shown stepwise in FIGS. 4 to 6. However, the operations of the arm members are not limited to those shown in FIGS. 4 to 6. As long as final (total) rotation angles satisfy the predetermined angles mentioned above, the arm members (50, 52, 56) may be rotated synchronously or non-synchronously. To be more specific, the main driving portion 48 and the sub driving portion 76 may be moved as follows: First, the first arm member 50 is rotated by the angle (θ2+θ5) and then the second arm member is rotated by the angle θ4.

As explained in the foregoing, according to the cassette transfer mechanism of this embodiment, the cassette C mounted on the cassette holder 36 with the wafer loading entrance 14 turned upwards and oriented to the X-direction, is transferred to the cassette chamber 18 while being raised vertically by the transfer mechanism 34 disposed outside the chamber container 20. Furthermore, according to the cassette transfer mechanism of this embodiment, the wafer loading entrance 14 of the cassette C can face the wafer unloading opening 24 and can be turned in the transfer arm access direction A simply by rotating the liftable stand 26 by a predetermined angle while it is being moved upward. Therefore, it is not required that the drawbridge-form moving mechanism is set in the chamber container 20, different from conventional transfer mechanisms. Hence, there are fewer driving mechanisms provided in the cassette chamber (vacuum chamber) 18. As a result, the particles generated within the cassette chamber 18 can be suppressed in amount. In contrast to the present invention, U.S. Pat. No. 5,186,594 must employ both rotation mechanisms for rotating the cassette C around the Y axis by 90 degrees and around the Z-axis by a predetermined angle within a cassette chamber. Due to the presence of a plurality of driving mechanisms, the construction of the cassette chamber is complicated, increasing the manufacturing cost and the amount of particles generated. However, the present invention does not require the driving mechanism for rotating the cassette C around the Y-axis. Therefore, the particle generation amount can be reduced by the amount ascribed to the Y-axis driving mechanism, as compared to U.S. Pat. No. 5,186,594. Because of the simple structure, a compact transfer mechanism and cost reduction are successfully attained.

The cassette chamber 18 according to this embodiment, has no diagonally extending rotation axis.

There are no portions unevenly moves in the rotation mechanism, so that the particle generation amount is low. In addition, since the cassette C is not necessary to rotate in the diagonal direction, a space required for the rotation can be reduced. Hence, a compact chamber 18 can be manufactured.

In this embodiment, a semiconductor wafer is used as a substrate. However, the substrate is not limited to it. A glass substrate and an LCD substrate may be used. The cassette chamber 18 of this embodiment is applied to a cluster tool. It may be adopted in other apparatus.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A cassette transfer mechanism comprising:
    a cassette chamber having a housing which forms a storing space for housing a cassette storing a plurality of substrates, a cassette loading entrance which is formed in the housing and allows the cassette to be loaded into and unloaded from the storing space, and a substrate unloading opening which is formed in the housing and allows at least one of the substrates to be loaded into and unloaded from the storing space;
    a liftable stand arranged in said storing space of the cassette chamber and being capable of moving up and down between a cassette receiving position for receiving the cassette and a position for unloading said at least one of the substrates through said substrate unloading opening;
    a cassette holder having a bottom-surface supporting portion for supporting a bottom surface of the cassette and a back-surface supporting portion for supporting a back surface of the cassette; and
    a moving mechanism provided outside the cassette chamber, said moving mechanism rotatably supporting the cassette holder and transferring the cassette on the cassette holder to the liftable stand at the cassette receiving position by rotating from a waiting position outside the cassette chamber to the cassette receiving position inside the cassette chamber through the cassette loading entrance,
    wherein said moving mechanism has rotation means for rotating the cassette holder around an axis approximately perpendicular to an axis which extends along the moving direction of the liftable stand.

2. The cassette transfer mechanism according to claim 1, wherein said liftable stand is rotatable around the axis extending along a moving direction of the liftable stand.

3. The cassette transfer mechanism according to claim 1, wherein a hole which permits the liftable stand to move up and down, is formed through the bottom-surface supporting portion of the cassette holder.

4. The cassette transfer mechanism according to claim 3, wherein said hole of the bottom-surface supporting portion is a U-shaped type having a pair of open ends.

5. The cassette transfer mechanism according to claim 1, wherein said rotation means rotates the cassette holder by 90 degrees.

6. The cassette transfer mechanism according to claim 5, wherein said rotation means rotates the cassette holder by 90 degrees when the cassette holder is moved from the waiting position to the liftable stand by the moving mechanism, with the result that the cassette, which is horizontally supported by the back-surface supporting portion of the cassette holder in the waiting position, is changed to being horizontally supported by the bottom-surface supporting portion of the cassette holder.

7. The cassette transfer mechanism according to claim 1, wherein said moving mechanism consists of a main driving axis rotatably supported at a portion outside the cassette chamber, a main driving portion for rotating the main driving axis, a pair of first arm members each having one end fixed on the main driving axis and the other end rotatably connected to the cassette holder, a pair of second arm members each having first and second ends, the first end rotatably connected to the main driving axis, a fixed axis having two ends to which the second end of each of the second arm members is connected, a third arm member having one end rotatably connected to the fixed axis and the other end rotatably connected to the cassette holder, and a rotation driving portion for rotating the second arm members.

8. The cassette transfer member according to claim 7, wherein said rotation driving portion consists of a sub driving axis rotatably supported by a portion outside the cassette chamber, a sub driving portion for rotating the sub driving axis, a gear fixed on the sub driving axis, and teeth engaged with said gear and formed at one end of the second arm members.

9. The cassette transfer mechanism according claim 7, wherein said rotation means rotates the second arm member around said main driving axis to operate the third arm member, thereby rotating the cassette holder around a connecting portion thereof with the first arm member.

10. A cassette transfer mechanism comprising:

a cassette chamber having a housing which forms a storing space for housing a cassette storing a plurality of substrates, a cassette loading entrance which is formed in the housing and allows the cassette to be loaded into and unloaded from the storing space;

a liftable stand arranged in said storing space of the cassette chamber and being capable of moving up and down between a cassette receiving position for receiving the cassette and a position for unloading said at least one of the substrates;

a cassette holder having a bottom-surface supporting portion for supporting a bottom surface of the cassette and a back-surface supporting portion for supporting a back surface of the cassette; and a moving mechanism provided outside the cassette chamber, said moving mechanism rotatably supporting the cassette holder, for moving the cassette holder between a waiting position outside the cassette chamber and the liftable stand inside the cassette chamber and transferring the cassette on the cassette holder to the liftable stand at the cassette receiving position by rotating from a waiting position outside the cassette chamber to the cassette receiving position inside the cassette chamber through the cassette loading entrance, wherein said moving mechanism has rotation means for rotating the cassette holder around an axis approximately perpendicular to an axis which extends along the moving direction of the liftable stand.

* * * * *